United States Patent [19]
Watanabe

[11] Patent Number: 6,165,334
[45] Date of Patent: Dec. 26, 2000

[54] DRY ETCHING APPARATUS

[75] Inventor: Koji Watanabe, Yokohama, Japan

[73] Assignee: Fujitsu Limited, Kawasaki, Japan

[21] Appl. No.: 08/152,089

[22] Filed: Nov. 15, 1993

Related U.S. Application Data

[63] Continuation of application No. 07/819,335, Oct. 31, 1990, abandoned.

[30] Foreign Application Priority Data

Nov. 2, 1989 [JP] Japan .................................. 1-286449

[51] Int. Cl.[7] ................................................. C23C 14/34
[52] U.S. Cl. .............................. 204/298.32; 204/192.33; 156/345
[58] Field of Search ........................ 204/192.32, 192.33, 204/298.31, 298.32; 156/345

[56] References Cited

U.S. PATENT DOCUMENTS

| | | | |
|---|---|---|---|
| 4,397,724 | 8/1983 | Moran . | |
| 4,419,201 | 12/1983 | Levinstein et al. ............ | 204/298.31 X |
| 4,427,516 | 1/1984 | Levinstein et al. ............ | 204/298.31 X |
| 4,491,496 | 1/1985 | Laporte et al. ................ | 204/298.31 X |
| 4,496,425 | 1/1985 | Kuyel ............................. | 204/192.33 X |

OTHER PUBLICATIONS

Bennett et al, "Selective . . . WSi$_2$", IBM Tech. Dis. Bulletin, vol. 25, No. 1 Jun. 1982, p. 33–34.
"Endpoint Detection in Plasma Etching", Roland et al, Journal of Vacuum Science & Technology/A, vol. 3, No. 3, May–Jun., 1985, pp. 631–636.
"Plasma Etching of Organic Materials. I. Polyimide in $O_2$–$CF_4$", Egitto et al, Journal of Vacuum Science & Technology/B, vol. 3, No. 3, May–Jun., 1985, pp. 893–904.
Patent Abstracts of Japan, vol. 8, No. 127 (E–250) [1564], Jun. 14, 1984, & JP–A–59 40 534, Mar. 6, 1984.
"Protective Cover for the Anode of a Plasma Enhanced Chemical Vapor Deposition Tool", IBM Technical Disclosure Bulletin, vol. 27, No. 10A, Mar., 1985, pp. 5666–5667.

*Primary Examiner*—Nam Nguyen
*Attorney, Agent, or Firm*—Arent Fox Kintner Plotkin & Kahn PLLC

[57] ABSTRACT

A dry etching apparatus comprises a reaction chamber having an inlet of an etching gas and an outlet of a product gas, a first electrode structure provided in the reaction chamber with a major surface adapted for supporting an object, a second electrode structure having a major surface that opposes the major surface of the first electrode structure with a parallel relationship, the second electrode structure having optical passage for passing an optical beam, the optical passage including a transparent window provided on a chamber wall of the reaction chamber, an aperture provided on the major surface of the second electrode structure in alignment with the window, and a void formed between the aperture and the window for freely passing a light beam between the window and the aperture, a cover member mounted detachable on the second electrode structure to cover the major surface thereof wherein the cover member having an aperture in alignment with the aperture on the major surface of the second electrode structure to pass an optical beam that has entered into the optical passage through the window and exiting through the aperture on the major surface of the second electrode structure; an optical source for producing coherent optical beam and directing the coherent optical beam to pass successively the optical passage in the second electrode structure and further through the aperture in the cover member, and an optical detector for detecting a reflection optical beam produced as a result of reflection of the incident coherent optical beam at the object and exiting after passing through the aperture in the cover member and the optical passage in the second electrode structure through the window on the wall of the reaction chamber.

6 Claims, 1 Drawing Sheet

DRY ETCHING APPARATUS

This application is a continuation of application Ser. No. 07/819,335 filed Oct. 31, 1990, abandoned.

BACKGROUND OF THE INVENTION

The present invention generally relates to fabrication of semiconductor devices and more particularly to a dry etching apparatus used for fabricating semiconductor devices.

The technique of dry etching, particularly the plasma etching, is an important process in the fabrication of semiconductor devices. A typical plasma etching apparatus has a pair of parallel electrode plates provided in a reaction chamber to oppose with each other, and carries out etching of an object by an etching reaction that is enhanced by a plasma formed between the electrodes. For this purpose, a high frequency electric field is established across the opposing electrodes, and the object is placed on one of the electrodes to face the other electrode.

The plasma etching apparatuses used in these days generally have a device for monitoring the thickness of the layer that is subjected to the etching such that a precise control of etching can be achieved. A typical example of such a device employs a laser beam for this purpose. More specifically, an object such as a semiconductor substrate is placed on one of the electrodes to face the other, opposing electrode, and a laser beam is irradiated on the substrate through an aperture provided on the opposing electrode. Further, a detection system is provided outside the reaction chamber for detecting a reflected laser beam produced upon reflection of the incident laser beam at the substrate. For this purpose, an optical device is provided so to intercept the reflected laser beam that exits from the aperture in the reversed direction to the incident laser beam.

Such a plasma etching apparatus generally has a transparent cover of quartz, for example, on the opposing electrode on which the aperture is provided to protect the electrode from unwanted etching. Thereby, unwanted contamination of the substrate by the deposition of metal such as aluminum that forms the electrode is avoided. The transparent cover further permits the passage of the incident and reflected laser beams, and thus, an exact control of the etching can be achieved.

In such a conventional plasma etching apparatus, however, there arises a problem in that various materials that are formed as a result of etching of the substrate are deposited on the inner wall of the reaction chamber, including the transparent cover. When such a deposition of materials occurs, it is necessary to break the vacuum of the reaction chamber and clean up the reaction chamber regularly. Such a cleaning of the transparent cover has to be made with about every 50 hours.

It should be noted that such deposition of materials occurs also on the quartz cover that covers the aperture of the opposing electrode. Thereby, the transmittance of the laser beam employed for the detection of the progress of the etching is gradually decreased. Because of this, the reliable detection of the end of etching is no longer possible when the apparatus is operated, for example, about 10 hours. This duration is significantly shorter than the interval between the cleaning operations of the reaction chamber. Thus, in the actual operation of the apparatus, one has to break the vacuum of the reaction chamber about every 10 hours, instead of every 50 hours, for cleaning the transparent cover. Each time such a break of vacuum is made, a preliminary running procedure is needed at the time of restarting the operation, to eliminate any moisture or gas that has been adsorbed on the wall of the reaction chamber. Thus, the problem of cleaning up of the transparent cover provides a serious problem in the efficiency of the etching procedure particularly when used in a mass-produce line.

SUMMARY OF THE INVENTION

Accordingly, it is a general object of the present invention to provide a novel and useful plasma etching apparatus wherein the foregoing problems are eliminated.

Another object of the present invention is to provide a plasma etching apparatus, wherein a reliable detection of end of the etching can be made throughout the duration that is allowed for the apparatus to operate without cleaning of a reaction chamber.

Another object of the present invention is to provide a plasma etching apparatus, comprising: a reaction chamber defined by a wall, said reaction chamber having an inlet for introducing a reactant gas and an outlet for exhausting a product gas; first electrode means provided in the reaction chamber, said first electrode means having a major surface for supporting an object thereon; second electrode means having a major surface opposing with the major surface of the first electrode means with a parallel relationship therebetween; said first and second electrode means being adapted to be applied with a high frequency voltage therebetween, said second electrode means having optical passage means comprising a transparent window provided on the wall of the reaction chamber and an aperture provided on the major surface of the second electrode means in optical communication with the window; a cover member mounted detachable on the second electrode means to cover the major surface thereof, said cover member having an aperture in alignment with the aperture on the major surface of the second electrode means to pass an optical beam; optical source means for producing an incident optical beam and directing the incident optical beam to the object passing through the window on the wall, the aperture in the second electrode means and further through the aperture in the cover member; and optical detection means for detecting a reflection optical beam, produced as a result of reflection of the incident optical beam at the object and exiting, after passing through the aperture in the cover member and the aperture in the second electrode means, through the window on the wall of the reaction chamber. According to the present invention, the passage of the incident and exiting optical beams is not interrupted at the cover member and any deposition of materials on the cover member that may cause a contamination of the cover member does not cause blockage of the optical beams or the degradation of the transmittance. Thereby, the need of frequent cleanup of the cover member is eliminated and the efficiency of operation of the etching apparatus is significantly improved without sacrificing the accuracy in the control of etching. Further, as the cover member is no longer required to be transparent, any desirable material including metals and ceramics may be used as the cover member of the second electrode means.

Other objects and further features of the present invention will become apparent from the following detailed description when read in conjunction with attached drawings.

DETAILED DESCRIPTION

Figure 1:
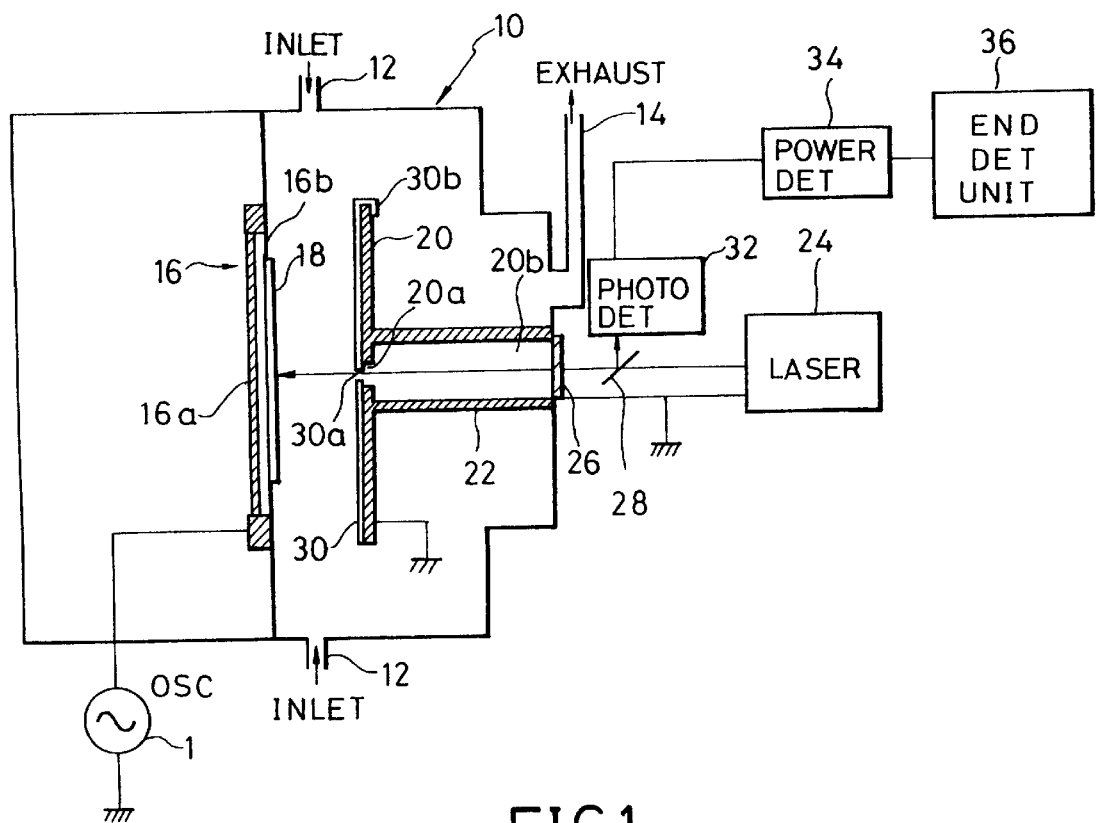
FIG. 1 is a diagram showing a plasma etching apparatus according to an embodiment of the present invention.

FIG. 1 shows an embodiment of the plasma etching apparatus according to the present invention.

Referring to FIG. 1, the plasma etching apparatus comprises a reaction chamber 10 defined by a wall on which one or more inlets 12 for introducing etching gases and an outlet 14 for exhausting product gases are provided. The outlet 14 is connected to a vacuum pump not illustrated. In the reaction chamber 10, there is provided an electrode 16 that comprises an aluminum disc 16a having a diameter of about 200 mm and a boron nitride holder 16b provided on the aluminum disc 16a for supporting a semiconductor substrate 18. In order to hold the substrate 18 on the boron nitride holder 16b, there is provided a silicon rubber chucking member that is not illustrated. The aluminum disc 16a is connected electrically to an oscillator 1 that produces a high frequency electric output typically of 13.56 MHz.

Opposing the electrode 16, there is provided a second electrode 20 of aluminum disc such that the electrode 20 is connected to the ground. Upon energization of the oscillator 1, there is established a plasma in the reaction chamber 10 in a region between the first and second electrodes and thereby the etching of the semiconductor substrate held on the first electrode 16 is made as a result of the excitation of the etching gas introduced into the reaction chamber 10. For example, the etching of silicon oxide or phosphosilicate glass (PSG) is achieved when a fluoride etching gas is used. During the operation, the reaction chamber 10 is continuously evacuated such that the pressure therein is held at a constant level. The etching thus achieved acts selectively on a particular crystal surface and shows anisotropy. The etching process is known as the reactive ion etching (RIE).

The surface of the electrode 20 is protected by a quartz cover 30 that is mounted detachable on the electrode 20. Thereby, the reaction between the aluminum surface of the electrode 20 and the etching gas is effectively avoided and the problem of contamination of the substrate during the process of plasma etching is eliminated.

Figure 2:
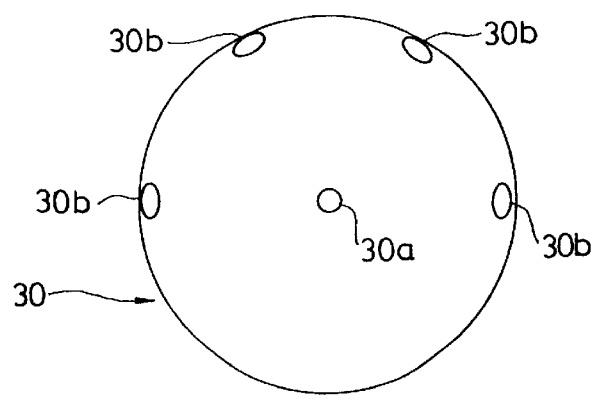
FIG. 2 is a diagram showing the cover member used in the apparatus of FIG. 1 to protect the electrode used therein.

FIG. 2 shows the quartz cover 30. As can be seen, the quartz cover 30 has a disc shape corresponding to the disc of the electrode 20, and there are provided catch members 30b for mounting the cover 30 detachable on the electrode 20. The catch member 30b is actually a claw that is formed at the rim part of the cover 30. Upon mounting of the cover 30, the claws 30b are hooked on the electrode 20.

In order to monitor the progress of the etching, a quartz window 26 is provided on the wall of the reaction chamber 10 and a laser beam is introduced into the reaction chamber 10 through the window 26. For this purpose, a laser source 24 is provided adjacent to the window 26. In order to allow passage of the laser beam, an aperture 20a is provided on the aluminum disc forming the electrode 20 in correspondence to the center of the electrode 20. The aperture 20a may have a diameter of about 10 mm in correspondence to the beam size of about 6 mm of the laser beam. In the present invention, the quartz cover 30 also has an aperture 30a generally at the center thereof in alignment with the aperture 20a such that the laser beam introduced into the reaction chamber 10 is directed to the surface of the substrate without interruption. The aperture 30a may also have a diameter of about 10 mm. Further, there is provided a hollow, tubular metal member 22 to connect the second electrode mechanically as well as electrically to the wall of the reaction chamber 10. It is actually this tubular member 22 that supports the second electrode 20 in the reaction chamber 10. The tubular member 22 is connected to the electrode 20 so as to surround the aperture 20a and connected to the wall of the reaction chamber 10 around the circumference of the window 26. Thereby the passage of the laser beam is formed in a space 20b inside the tubular member 22.

In order to monitor the progress of the etching, a semitransparent mirror or half mirror 28 is provided in the optical path of the laser beam at outside of the reaction chamber 20 for deflecting the reflection beam that is formed by the reflection of the laser beam at the surface of the substrate 18. The half mirror 28 passes freely the laser beam that is produced by the laser source 24 and directed to the window 26 while reflects the reflection beam in a direction generally perpendicular to the optical path of the laser beam. On the path of the deflected reflection beam, there is provided a photodetector 32 that detects the intensity of the reflection beam. The photodetector 32 produces an output signal indicative of the detected intensity and the output of the photodetector 32 is measured by a power meter 34. The power meter 34 is connected to an end detector unit 36 that detects the end of etching according to the principle described below.

Upon irradiation of the laser beam, there is formed an interference between the incident laser beam and the reflection beam such that the intensity of the beam detected by the detector 32 is changed alternately with the progress of the etching. In other words, the intensity of the output of the photodetector 32, detected by the power meter 34, is changed alternately in a unit time. As the alternating change in the intensity of the detected laser beam is caused as a result of the Moire fringes, the number of changes in a unit time is related to the thickness of the substrate when the etching is progressed at a constant speed. Thus, the end detection unit 34 detects the thickness of the layer to be etched by counting the number of changes in the intensity of the laser beam detected by the detector 32.

In the present invention, the detection of the thickness of the layer that is subjected to the etching is detected exactly and with reliability, as the optical path of the laser beam introduced into the reaction chamber 10 is not obstructed by the quartz cover 30. In other words, even after a prolonged use that invites a deposition of materials on the quartz cover 30, the path of the laser beam is free and the laser beam incident to the substrate or the laser beam reflected at the substrate passes through the optical path in the tubular member 22 without losing the intensity.

It should be noted that the tubular member 22 surrounds the optical path of the laser beam including the quartz window 26. Thus, the deposition of the material on the window 26 during the etching process is held minimum and the problem of decrease in the intensity of the laser beam does not occur. Preferably, the window 26 is separated from the electrode by a distance of about 100 mm or more. The fact that the aperture 20a or 30a has the diameter of only 10 mm also contributes to the elimination of invasion of the product of the etching reaction into the space formed in the tubular member 22.

According to the present invention, an efficient operation of the apparatus is achieved by eliminating the frequent cleanup procedure while still maintaining the exact monitoring of the thickness of the layer under etching.

Obviously, the cover member 30 is not limited to quartz or any transparent material but silicon or other opaque materials may be used as long as the material does not cause contamination of the substrate and can endure the temperature that appears during the etching process. For example, the cover member 30 may be formed of silicon. Further, the apertures 20*a* and 30*a* are not limited to the circular holes as disclosed in FIG. 2, but any form of apertures such as triangular or rectangular may be used. Further, the position where the aperture 20*a* or 30*a* is provided in not limited on the center of the circular electrode 20 but may offset as long as the apertures 20*a* and 30*a* are in optical communication with the window 26 via the space 20*b* inside the tubular member 22. In correspondence to this, the number of aperture 20*a* or the number of aperture 30*a* is not limited to one.

Further, the present invention is not limited to the embodiments described heretofore, but various variations and modifications may be made without departing from the scope of the invention.

What is claimed is:

1. A dry etching apparatus for etching an object, comprising:

a reaction chamber defined by a chamber wall, said reaction chamber having an inlet for introducing an etching gas and an outlet for exhausting a product gas formed as a result of etching;

fist electrode means provided in the reaction chamber, said first electrode means having a major surface adapted for supporting an object thereon;

second electrode means having a major surface that opposes the major surface of the first electrode means with a parallel relationship between the opposing major surfaces of the first and second electrode means, said first and second electrode means being adapted to be applied with a high frequency voltage therebetween for establishing a high frequency electric field, said second electrode means having optical passage means therein for passing an optical beam, said optical passage means comprising a transparent window provided on the chamber wall of the reaction chamber, an aperture provided on the major surface of the second electrode means in alignment with the window, and a void formed between the aperture and the window for freely passing the optical beam between the window and the aperture, said second electrode means further comprising a metal disc facing the major surface of the first electrode means and a hollow, tubular connection member connecting the metal disc to the wall of the reaction chamber, said tubular connection member having a wall that surrounds the void forming optical path means, said aperture of said second electrode means being provided at a radially central part of said second electrode means;

a cover member mounted detachably on the second electrode means to cover the major surface thereof, said cover member having an aperture in alignment with the aperture on the major surface of the second electrode means to pass an optical beam that has entered into the optical passage means through the window and exiting from the aperture on the major surface of the second electrode means, said aperture of said cover member being provided at a radially central part of said cover member;

optical source means for producing a coherent optical beam and directing the coherent optical beam to the object along an optical path that passes the optical passage means in the second electrode means successively through the window, the void and the aperture on the second electrode means and further through the aperture on the cover member; and optical detection means for detecting a reflection optical beam, produced as a result of reflection of the coherent optical beam at the object and exiting from the window on the wall of the reaction chamber after passing through the optical path of the coherent optical beam in a reversed direction.

2. A dry etching apparatus as claimed in claim 1 in which said cover member comprises quartz.

3. A dry etching apparatus as claimed in claim 1 in which said cover member comprises silicon.

4. A dry etching apparatus as claimed in claim 1 in which said cover member comprises a material that keeps the object free from contamination when the object is subjected to etching.

5. A dry etching apparatus as claimed in claim 1 in which said aperture formed in the cover member has a diameter of about 10 mm.

6. A dry etching apparatus as claimed in claim 1 in which said first and second electrode means establish a plasma therebetween upon application of the high frequency voltage for enhancement of the etching.

* * * * *